United States Patent
Irieda et al.

(10) Patent No.: US 10,396,759 B2
(45) Date of Patent: Aug. 27, 2019

(54) FILTER AND MULTIPLEXER

(71) Applicant: TAIYO YUDEN CO., LTD., Tokyo (JP)

(72) Inventors: Taisei Irieda, Tokyo (JP); Tokihiro Nishihara, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 59 days.

(21) Appl. No.: 15/818,467

(22) Filed: Nov. 20, 2017

(65) Prior Publication Data
US 2018/0159508 A1  Jun. 7, 2018

(30) Foreign Application Priority Data
Dec. 5, 2016 (JP) ................... 2016-235918

(51) Int. Cl.
*H03H 9/56* (2006.01)
*H03H 9/70* (2006.01)
(Continued)

(52) U.S. Cl.
CPC ........ *H03H 9/706* (2013.01); *H03H 9/02086* (2013.01); *H03H 9/0523* (2013.01);
(Continued)

(58) Field of Classification Search
CPC ................... H03H 9/54–62; H03H 9/70–706
(Continued)

(56) References Cited

U.S. PATENT DOCUMENTS 6,949,990 B2 * 9/2005 Nishihara ............ H03H 9/0523
333/189
7,173,504 B2 * 2/2007 Larson, III ............ H03H 9/132
333/189
(Continued)

FOREIGN PATENT DOCUMENTS

JP        2004-120016 A     4/2004
JP         2007-6495 A      1/2007
(Continued)

OTHER PUBLICATIONS

Japanese Office Action dated Feb. 5, 2019, in a counterpart Japanese patent application No. 2016-235918. (A machine translation (not reviewed for accuracy) attached.)

*Primary Examiner* — Dean O Takaoka
*Assistant Examiner* — Alan Wong
(74) *Attorney, Agent, or Firm* — Chen Yoshimura LLP

(57) ABSTRACT

A filter includes: a first substrate; first and second piezoelectric thin film resonators located on the first substrate, each of the resonators including first and second electrodes facing each other across a piezoelectric film, a crystal orientation from the first electrode to the second electrode of the piezoelectric film being the same between the resonators, the first electrodes of the resonators connecting to each other in a connection region between resonance regions where the first and second electrodes face each other across the piezoelectric film, the second electrodes of the resonators failing to connect to each other, and an area of the resonance region being approximately the same between the resonators, a second substrate mounting the first substrate across an air gap; and a ground pattern located on the second substrate and not overlapping with the first electrode located in the resonance regions and the connection region.

10 Claims, 23 Drawing Sheets

(51) Int. Cl.
*H03H 9/205* (2006.01)
*H03H 9/02* (2006.01)
*H03H 9/05* (2006.01)
*H03H 9/58* (2006.01)
*H03H 9/60* (2006.01)

(52) U.S. Cl.
CPC ............ *H03H 9/205* (2013.01); *H03H 9/564* (2013.01); *H03H 9/568* (2013.01); *H03H 9/587* (2013.01); *H03H 9/605* (2013.01)

(58) Field of Classification Search
USPC .................................................. 333/186–192
See application file for complete search history.

(56) References Cited

U.S. PATENT DOCUMENTS

| | | | | |
|---|---|---|---|---|
| 7,378,922 B2* | 5/2008 | Kubo | ............ | B81C 1/00238 333/133 |
| 7,535,323 B2* | 5/2009 | Barber | ............ | H03H 9/02086 310/357 |
| 7,548,140 B2* | 6/2009 | Jamneala | ............ | H03H 9/581 310/357 |
| 7,675,154 B2* | 3/2010 | Hong | ............ | H03H 9/0547 257/685 |
| 8,018,298 B2* | 9/2011 | Ueda | ............ | H03H 9/562 333/133 |
| 8,836,449 B2* | 9/2014 | Pang | ............ | H03H 9/0571 333/187 |
| 9,099,987 B2* | 8/2015 | Maurer | ............ | H03H 9/605 |
| 10,090,825 B2* | 10/2018 | Kuroyanagi | ............ | H01L 23/5226 |
| 2004/0104790 A1 | 6/2004 | Nishihara et al. | | |
| 2006/0290446 A1 | 12/2006 | Aigner et al. | | |
| 2008/0055021 A1 | 3/2008 | Ueda et al. | | |
| 2008/0246556 A1 | 10/2008 | Heinze et al. | | |
| 2012/0176206 A1 | 7/2012 | Inoue et al. | | |
| 2016/0191015 A1* | 6/2016 | Ivira | ............ | H03H 9/02118 333/190 |

FOREIGN PATENT DOCUMENTS

| | | |
|---|---|---|
| JP | 2008-508822 A | 3/2008 |
| JP | 2008-85989 A | 4/2008 |
| JP | 2008-271421 A | 11/2008 |
| JP | 2011-71874 A | 4/2011 |

* cited by examiner

FIG. 3A
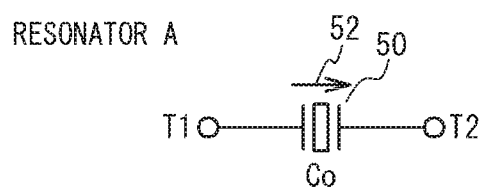
FIG. 3B
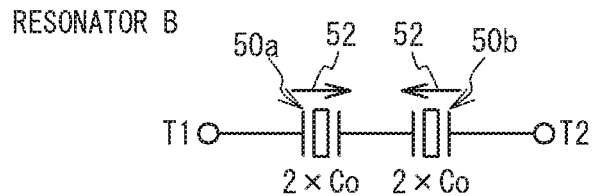
FIG. 3C
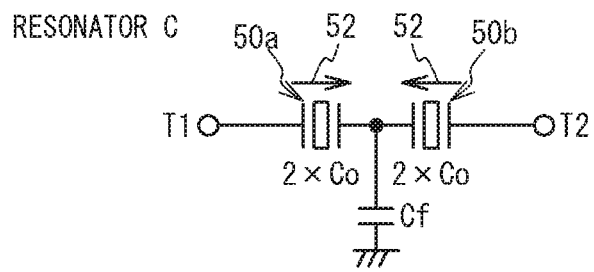
FIG. 3D
| Co [pF] | fr [MHz] | k² [%] | Cf [pF] |
|---|---|---|---|
| 2.0 | 2500 | 7.04 | 0.03 |

|  | S1 | S2 | S3 | S4a, S4b | P1 | P2 | P3a, P3b |
|---|---|---|---|---|---|---|---|
| ELECTROSTATIC CAPACITANCE VALUE [pF] | 0.714 | 0.759 | 0.804 | 1.525 | 1.971 | 0.954 | 3.494 |
| RESONANT FREQUENCY [GHz] | 2533 | 2533 | 2541 | 2545 | 2462 | 2472 | 2461 |

FILTER AND MULTIPLEXER

CROSS-REFERENCE TO RELATED APPLICATION

This application is based upon and claims the benefit of priority of the prior Japanese Patent Application No. 2016-235918, filed on Dec. 5, 2016, the entire contents of which are incorporated herein by reference.

FIELD

A certain aspect of the present invention relates to a filter and a multiplexer.

BACKGROUND

Surface acoustic wave devices have been used for filters and duplexers of wireless communication devices such as mobile phone terminals. Recently, acoustic wave devices having a structure designed to have a piezoelectric substance sandwiched between a lower electrode and an upper electrode have attracted attention as the element that has good characteristics at high frequencies and is capable of being reduced in size and made monolithic. Examples of such acoustic wave devices include piezoelectric thin film resonators such as film bulk acoustic resonators (FBARs) and solidly mounted resonators (SMRs).

When large electric power is input to the piezoelectric thin film resonator, harmonics are generated in output signals due to the non-linearity that depends on the polarization direction of the piezoelectric substance. As a method for reducing such harmonics, there has been known a method that divides the piezoelectric thin film resonator as described in, for example, Japanese Patent Application Publication Nos. 2008-85989 and 2007-6495. Additionally, it has been known that a floating capacitance is formed between the electrode of the piezoelectric thin film resonator and the metal layer formed on the underside of the substrate as described in, for example, Patent Application Publication No. 2008-508822. To inhibit the electromagnetic coupling between wiring lines interconnecting the piezoelectric thin film resonators, it has been known to shield the wiring lines as described in, for example, Japanese Patent Application Publication No. 2011-71874.

However, it is newly found that harmonics cannot be reduced even when the piezoelectric thin film resonator is divided.

SUMMARY OF THE INVENTION

According to a first aspect of the present invention, there is provided a filter including: a first substrate; a first piezoelectric thin film resonator and a second piezoelectric thin film resonator located on a lower surface of the first substrate, each of the first piezoelectric thin film resonator and the second piezoelectric thin film resonator including a piezoelectric film, and a first electrode and a second electrode facing each other across the piezoelectric film, a crystal orientation from the first electrode to the second electrode of the piezoelectric film of the first piezoelectric thin film resonator being identical to that of the second piezoelectric thin film resonator in a resonance region where the first electrode and the second electrode face each other across the piezoelectric film, the first electrodes of the first piezoelectric thin film resonator and the second piezoelectric thin film resonator connecting to each other in a connection region between the resonance regions, the second electrodes of the first piezoelectric thin film resonator and the second piezoelectric thin film resonator failing to connect to each other in the connection region, and an area of the resonance region of the first piezoelectric thin film resonator being approximately equal to that of the second piezoelectric thin film resonator, a second substrate including the first substrate mounted on an upper surface of the second substrate so that the upper surface faces the lower surface of the first substrate across an air gap; and a ground pattern that is located on the upper surface of the second substrate, and does not overlap with the first electrode located in the resonance regions of the first piezoelectric thin film resonator and the second piezoelectric thin film resonator and the connection region in plan view.

According to a second aspect of the present invention, there is provided a multiplexer including the above filter.

BRIEF DESCRIPTION OF THE DRAWINGS

FIG. 3A through FIG. 3C are circuit diagrams of resonators A through C, respectively, and FIG. 3D presents simulation conditions;

DETAILED DESCRIPTION

Figure 1A:
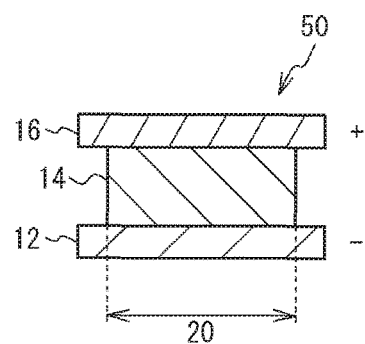
FIG. 1A and FIG. 1B are cross-sectional views of a piezoelectric thin film resonator.
Figure 1B:
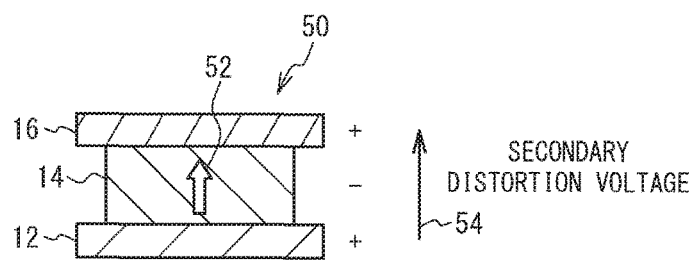

First, a description will be given of an example that reduces the secondary distortion of a piezoelectric thin film resonator. FIG. 1A and FIG. 1B are cross-sectional views of a piezoelectric thin film resonator. As illustrated in FIG. 1A, in a piezoelectric thin film resonator 50, a lower electrode 12 and an upper electrode 16 face each other across at least a part of a piezoelectric film 14. The region where the lower electrode 12 and the upper electrode 16 face each other across the piezoelectric film 14 is a resonance region 20. The half of the wavelength λ of the resonant frequency approximately corresponds to the thickness of the piezoelectric film 14. That is, the piezoelectric thin film resonator 50 uses ½λ thickness resonance. Thus, when the lower electrode 12 polarizes, for example, negative (−), the upper electrode 16 polarizes positive (+). One of the upper and lower surfaces of the piezoelectric film 14 polarizes positive (+) and the other polarizes negative (−).

As illustrated in FIG. 1B, the wavelength of the frequency of the secondary distortion approximately corresponds to the thickness of the piezoelectric film 14. Thus, the acoustic wave is excited so that both the upper and lower surfaces of the piezoelectric film 14 polarize positive (+) or negative (−) and the center of the piezoelectric film 14 polarizes negative (−) or positive (+). When the piezoelectric film 14 is symmetric in the vertical direction, the secondary distortions of the upper electrode 16 and the lower electrode 12 have identical electric potentials. Thus, the secondary distortion component is not generated. However, when the piezoelectric film 14 is made of, for example, aluminum nitride (AlN) or zinc oxide (ZnO), the piezoelectric film 14 is oriented in the c-axis orientation to achieve good characteristics. The arrow indicates a c-axis orientation direction 52 (i.e., the polarization direction). At this time, the symmetry in the c-axis orientation is distorted in the piezoelectric film 14, and the electric field has uneven distributions. The uneven distribution causes an electric potential difference between the upper electrode 16 and the lower electrode 12. A voltage generated by the secondary distortion is referred to as a secondary distortion voltage. When the direction from the lower electrode 12 to the upper electrode 16 is in the c-axis orientation direction 52, a secondary distortion voltage 54 is generated in the same direction as the c-axis orientation direction 52.

Figure 2A:
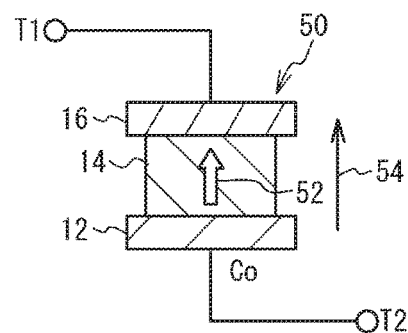
FIG. 2A illustrates a single piezoelectric thin film resonator.
Figure 2B:
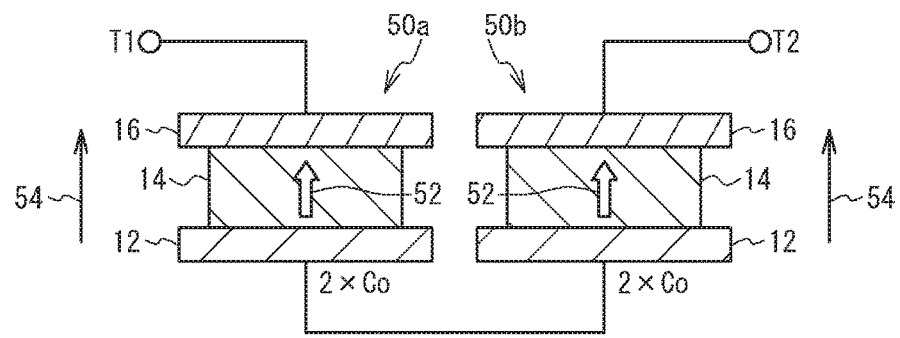
FIG. 2B and FIG. 2C illustrate piezoelectric thin film resonators divided in series.
Figure 2C:
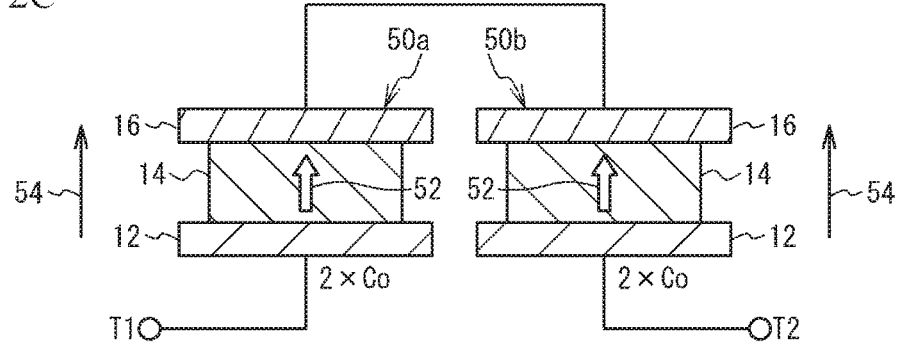

A method of reducing the secondary distortion voltage will be described with reference to FIG. 2A through FIG. 2C. FIG. 2A illustrates a single piezoelectric thin film resonator, and FIG. 2B and FIG. 2C illustrate piezoelectric thin film resonators divided in series. As illustrated in FIG. 2A, the piezoelectric thin film resonator 50 is connected in series between a terminal T1 and a terminal T2. The secondary distortion voltage 54 is generated in the c-axis orientation direction 52. The electrostatic capacitance of the piezoelectric thin film resonator 50 is Co.

As illustrated in FIG. 2B and FIG. 2C, the piezoelectric thin film resonator 50 is serially divided into resonators 50a and 50b. The electrostatic capacitance of each of the resonators 50a and 50b is 2×Co. Accordingly, high-frequency characteristics including impedance between the terminals T1 and T2 are approximately the same between FIG. 2A and FIG. 2B and FIG. 2C.

In FIG. 2B, the lower electrodes 12 of the resonators 50a and 50b are interconnected, and the upper electrodes 16 of the resonators 50a and 50b are respectively connected to the terminals T1 and T2. That is, both the lower electrodes 12 have identical electric potentials. In FIG. 2B, the upper electrodes 16 of the resonators 50a and 50b are interconnected, and the lower electrodes 12 of the resonators 50a and 50b are respectively connected to the terminals T1 and T2. That is, both the upper electrodes 16 have identical electric potentials. In FIG. 2B and FIG. 2C, the c-axis orientation directions 52 of the resonators 50a and 50b are opposite to each other as viewed from the terminal T1 (or T2). Thus, the division as in FIG. 2B will be called reverse series division. In the reverse series division, the secondary distortion voltages 54 in the resonators 50a and 50b cancel out each other, and thereby, harmonics emitted from the terminals T1 and T2 are reduced.

Second harmonics are simulated for three resonators A through C. FIG. 3A through FIG. 3C are circuit diagrams of the resonators A through C, respectively, and FIG. 3D presents simulation conditions.

As illustrated in FIG. 3A, in the resonator A, the piezoelectric thin film resonator 50 is connected in series between the terminals T1 and T2. The c-axis orientation direction of the piezoelectric thin film resonator 50 is in the direction from the terminal T1 to the terminal T2. The electrostatic capacitance of the piezoelectric thin film resonator 50 is Co.

As illustrated in FIG. 3B, in the resonator B, the resonators 50a and 50b, which are divided in reverse series, are connected between the terminals T1 and T2. The c-axis orientation direction 52 of the resonator 50a is in a direction away from the terminal T1, and the c-axis orientation direction 52 of the resonator 50b is in a direction away from the terminal T2. The electrostatic capacitance of each of the resonators 50a and 50b is 2×Co.

As illustrated in FIG. 3C, in the resonator C, a floating capacitor of which the electrostatic capacitance is Cf is connected between a wiring line connecting the resonators 50a and 50b and a ground. Other structures are the same as those of the resonator B.

As presented in FIG. 3D, the electrostatic capacitance Co, the resonant frequency fr, and the electromechanical coupling coefficient $k^2$ in each of the piezoelectric thin film resonator 50 and the resonators 50a and 50b were respectively assumed to be 2.0 pF, 2500 MHz, and 7.04%. The floating capacitance Cf was assumed to be 0.03 pF.

In the simulation, the magnitude of the second harmonic emitted from one of the terminals T1 and T2 when a high-frequency signal of 28 dBm is input to the other of the terminals T1 and T2 was calculated. The second harmonic can be calculated based on a non-linear current that is proportional to "the square of the electric field intensity" applied to the piezoelectric film 14, "the product of the electric field intensity and the strain", and "the square of the strain".

Figure 4A:
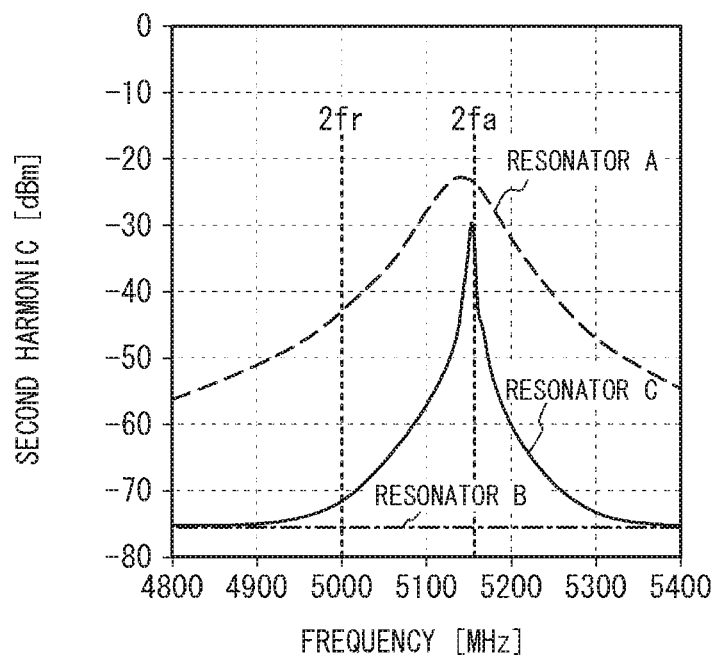
FIG. 4A is a graph of second harmonic versus frequency in the resonators A through C.

FIG. 4A is a graph of second harmonic versus frequency in the resonators A through C. The frequency corresponds to double the high-frequency signal that has been input. The frequency twice the resonant frequency is represented by 2 fr, and the frequency twice the antiresonant frequency is represented by 2 fa.

As illustrated in FIG. 4A, in the resonator A, the second harmonic has gentle single-peaked characteristics having a peak at a frequency closer to 2 fa between 2 fr and 2 fa. In the resonator B, the magnitude of the second harmonic is very small, approximately −75 dBm, and is flat with respect to frequency. In the resonator C, the second harmonic has single-peaked characteristics having a peak at a frequency around 2 fa. When the frequency increases or decreases from 2 fa, the second harmonic decreases to the level identical to that of the resonator B. For example, the second harmonic at 2 fr is approximately the same as that of the resonator B.

The reverse series division as in the resonator B reduces second harmonic. However, when the floating capacitance Cf is added to the wiring line between the resonators 50a and 50b as in the resonator C, the second harmonics are not cancelled between the resonators 50a and 50b, and the second harmonic becomes large at a frequency around 2 fa.

Figure 4B:
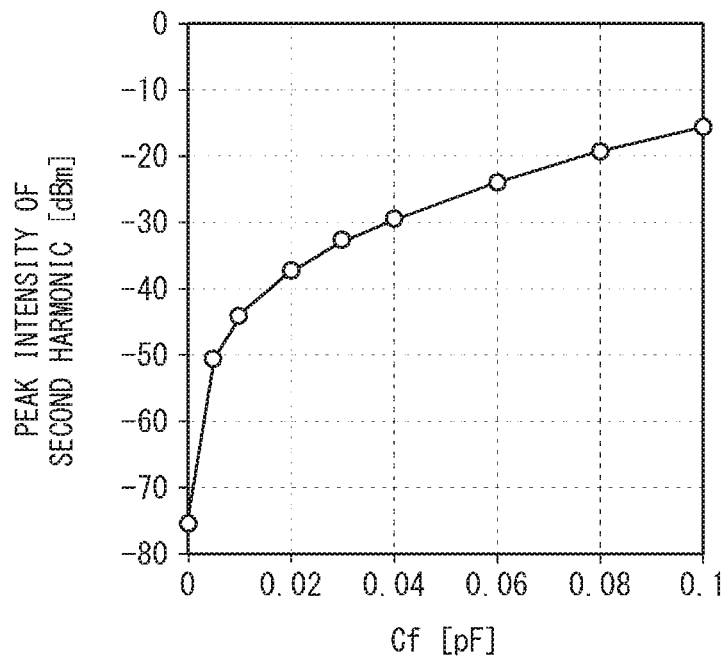
FIG. 4B is a graph of the peak intensity of second harmonic versus floating capacitance.

FIG. 4B is a graph of the peak intensity of second harmonic versus floating capacitance. As illustrated in FIG. 4B, when the floating capacitance Cf is 0, the peak intensity of the second harmonic is as small as −75 dBm, but the peak intensity of second harmonic increases as the floating capacitance Cf increases. As described above, as the floating capacitance Cf increases, the second harmonic that has not been canceled and remains increases. This reveals that it is important to reduce the floating capacitance Cf of the wiring line between the resonators 50a and 50b.

Figure 5A:
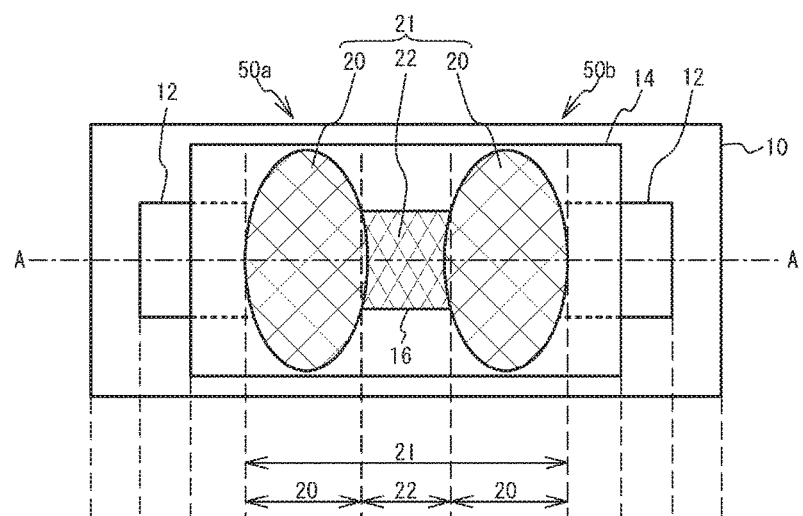
FIG. 5A is a plan view of a resonator divided in reverse series corresponding to FIG. 2C.
Figure 5B:
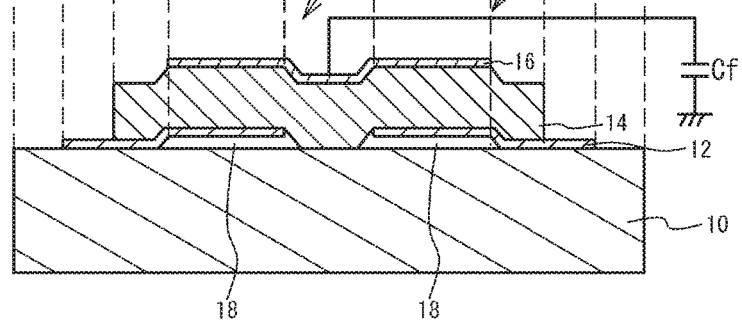
FIG. 5B is a cross-sectional view taken along line A-A in FIG. 5A.

FIG. 5A is a plan view of a resonator that is divided in reverse series corresponding to FIG. 2C, and FIG. 5B is a cross-sectional view taken along line A-A in FIG. 5A. As illustrated in FIG. 5A and FIG. 5B, in each of the resonators 50a and 50b, the lower electrode 12 is located on the substrate 10 that is, for example, a silicon (Si) substrate. The lower electrode 12 includes, for example, a chrome (Cr) film and a ruthenium (Ru) film stacked in this order from the substrate 10 side. An air gap 18 having a dome-shaped bulge is formed between the flat principal surface of the substrate 10 and the lower electrode 12. The dome-shaped bulge is a bulge having a shape in which the height of the air gap 18 is low in the periphery of the air gap 18 and increases at closer distances to the center of the air gap 18, for example. Located on the lower electrode 12 is the piezoelectric film 14 mainly composed of aluminum nitride (AlN) having a main axis in the (002) direction. The upper electrode 16 is located on the piezoelectric film 14. The upper electrode 16 is formed of, for example, a Ru film and a Cr film stacked in this order from the piezoelectric film 14 side.

In the resonators 50a and 50b, the lower electrodes 12, the piezoelectric films 14, and the upper electrodes 16 are formed by the same process. Thus, between the resonators 50a and 50b, the material and the film thickness of the lower electrode 12 are practically the same, the material and the film thickness of the piezoelectric film 14 are practically the same, and the material and the film thickness of the upper electrode 16 are practically the same.

The resonators 50a and 50b share the piezoelectric film 14 and the upper electrode 16. The upper electrodes 16 of the resonators 50a and 50b are interconnected. The region in which the upper electrode 16 is located between the resonance regions 20 of the resonators 50a and 50b is a connection region 22. The lower electrodes 12 and the air gaps 18 are not respectively connected in the connection region 22.

The substrate 10 may be, for example, a sapphire substrate, a spinel substrate, and an alumina substrate instead of a Si substrate. The lower electrode 12 and the upper electrode 16 may be formed of, for example, a single layer metal film of aluminum (Al), titanium (Ti), copper (Cu), molybdenum (Mo), tungsten (W), tantalum (Ta), platinum (Pt), rhodium (Rh), or iridium (Ir), or a multilayered film of at least two of them instead of Cr and Ru.

The piezoelectric film 14 may be, for example, a zinc oxide (ZnO) film instead of an AlN film. Alternatively, the piezoelectric film 14 may be mainly composed of aluminum nitride, and contain other elements to improve the resonance characteristic or the piezoelectricity. For example, use of scandium (Sc) as an additive element improves the piezoelectricity of the piezoelectric film 14.

The upper electrode 16 in the connection region 22 corresponds to the wiring line connecting the resonators 50a and 50b in FIG. 3C. Thus, the floating capacitance Cf between the upper electrode 16 in the connection region 22 and a ground corresponds to the floating capacitance Cf in FIG. 3C. The upper electrode 16 in the connection region 22 and the upper electrodes 16 in the resonance regions 20 are electrically connected. Thus, the capacitance formed between the upper electrode 16 in a region 21 combining the resonance regions 20 and the connection region 22 and a ground practically corresponds to the floating capacitance Cf.

Figure 6A:
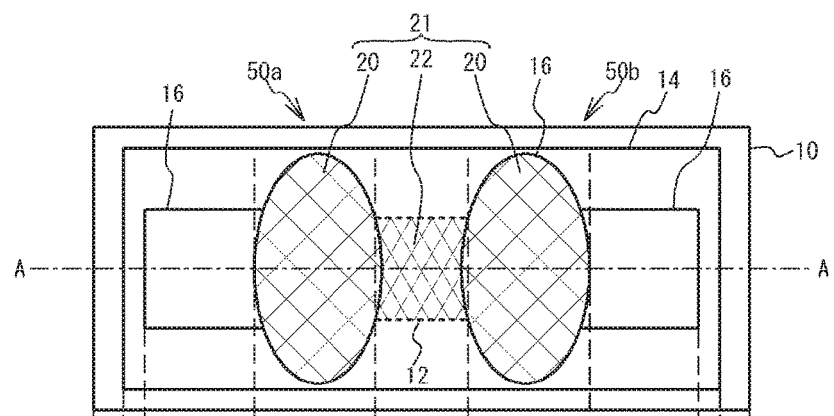
FIG. 6A is a plan view of another example of a resonator divided in reverse series corresponding to FIG. 2B.
Figure 6B:
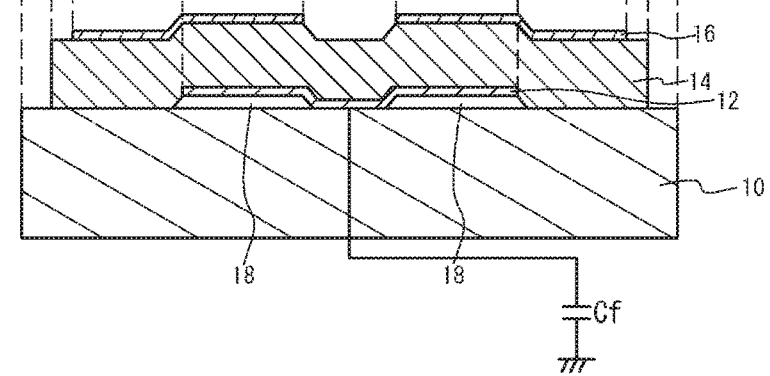
FIG. 6B is a cross-sectional view taken along line A-A in FIG. 6A.

FIG. 6A is a plan view of another example of a resonator that is divided in reverse series corresponding to FIG. 2B, and FIG. 6B is a cross-sectional view taken along line A-A in FIG. 6A. As illustrated in FIG. 6A and FIG. 6B, the resonators 50a and 50b share the piezoelectric film 14 and the lower electrode 12. The lower electrodes 12 of the resonators 50a and 50b are interconnected. The region where the lower electrode 12 is located between the resonance regions 20 of the resonators 50a and 50b is the connection region 22. The upper electrodes 16 are not connected and the air gaps 18 are not connected in the connection region 22. The capacitance formed between the upper electrode 16 in the region 21 combining the resonance regions 20 and the connection region 22 and a ground practically corresponds to the floating capacitance Cf. Other structures are the same as those of FIG. 5A and FIG. 5B, and the description thereof is thus omitted.

FIRST COMPARATIVE EXAMPLE

Figure 7A:
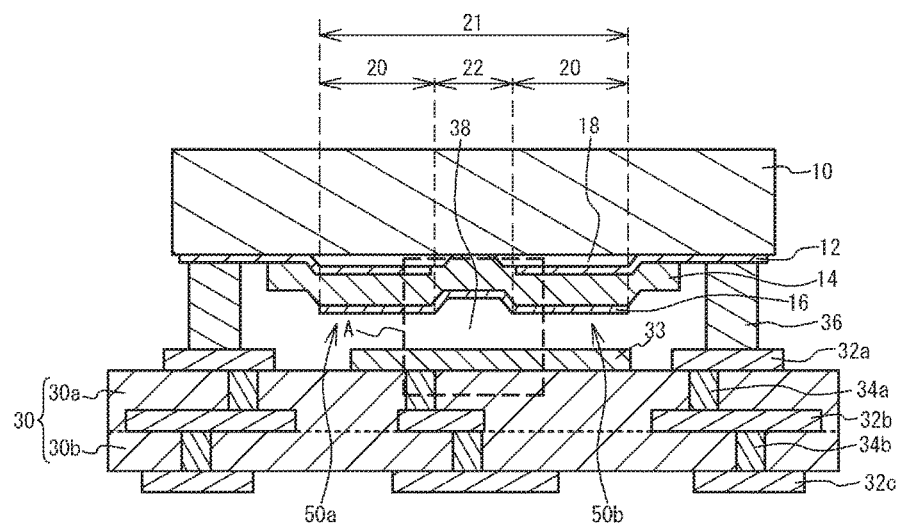
FIG. 7A is a cross-sectional view illustrating a state where serially-divided resonators are mounted on a substrate in a first comparative example.

A description will be given of a first comparative example in which the floating capacitance Cf is added. FIG. 7A is a cross-sectional view of a filter in which serially-divided resonators are mounted on a substrate in the first comparative example, and FIG. 7B is an enlarged view of a region A in FIG. 7A.

Figure 7B:
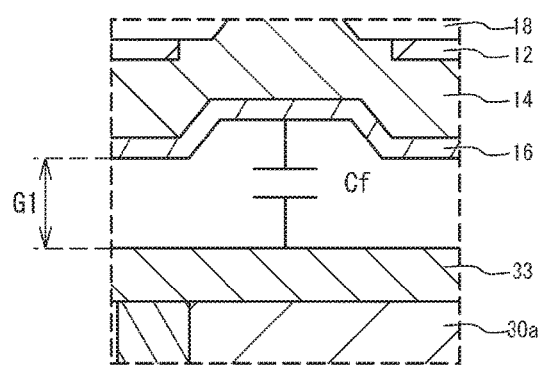
FIG. 7B is an enlarged view of a region A in FIG. 7A.

As illustrated in FIG. 7A and FIG. 7B, the substrate 10 is mounted on the upper surface of a substrate 30. The substrate 30 is an insulating substrate, and is, for example, a ceramic substrate made of high temperature co-fired ceramic (HTCC) or low temperature co-fired ceramic (LTCC), or a resin substrate. The substrate 30 includes a plurality of insulating layers 30a and 30b that are stacked.

Metal layers 32a and 32b are respectively formed on the upper surfaces of the insulating layers 30a and 30b, and a metal layer 32c is formed on the lower surface of the insulating layer 30b. Via wirings 34a and 34b respectively penetrating through the insulating layers 30a and 30b are provided. The via wiring 34a electrically connects the metal layers 32a and 32b, and the via wiring 34b electrically connects the metal layers 32b and 32c. A ground pattern 33 made of the metal layer 32a is formed on the upper surface of the substrate 30. The metal layers 32a through 32b and the via wirings 34a and 34b are formed of metal layers such as copper layers, gold layers, or aluminum layers.

The substrate 10 is flip-chip mounted on the substrate 30 with use of bumps 36. The bump 36 is, for example, a copper bump, a gold bump, or a solder bump. The resonators 50a and 50b face the upper surface of the substrate 30 across an air gap 38. The resonators 50a and 50b are the resonator described in FIG. 5A and FIG. 5B.

The distance G1 between the upper electrode 16 and the ground pattern 33 depends on the height of the bump 36, but is approximately 10 μm. In plan view, when the region 21 combining the resonance regions 20 and the connection region 22 overlaps with the ground pattern 33, the floating capacitance Cf between the upper electrode 16 and the ground pattern 33 across the air gap 38 in FIG. 5B becomes large.

First Embodiment

Figure 8A:
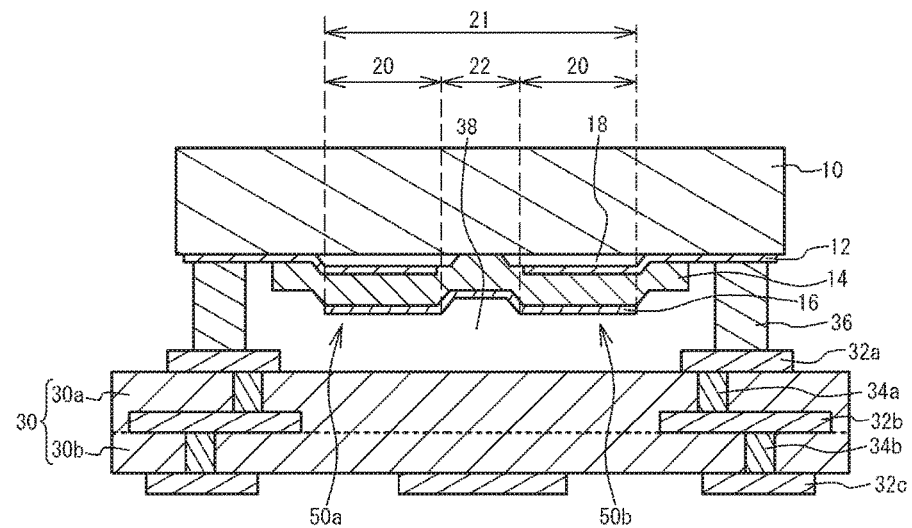
FIG. 8A and FIG. 8B are cross-sectional views of filters in accordance with a first embodiment and a first variation thereof, respectively.
Figure 8B:
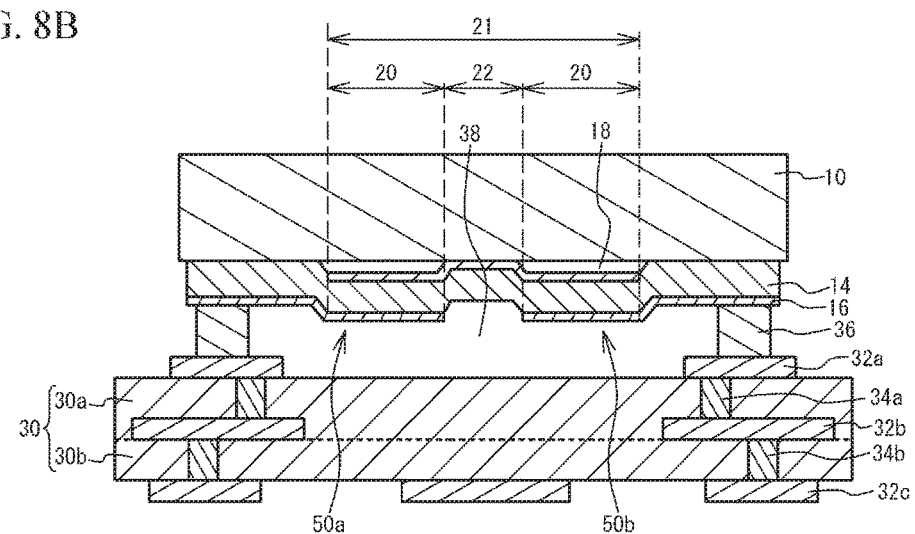

FIG. 8A and FIG. 8B are cross-sectional views of filters in accordance with a first embodiment and a first variation thereof, respectively. As illustrated in FIG. 8A, in the first embodiment, a filter includes the resonators 50a and 50b. The resonators 50a and 50b are the resonator illustrated in FIG. 5A and FIG. 5B, and the upper electrodes 16 of the resonators 50a and 50b are interconnected in the connection region 22. The region 21 combining the resonance regions 20 and the connection region 22 does not overlap with the ground pattern 33. Other structures are the same as those of the first comparative example illustrated in FIG. 7A, and the description thereof is thus omitted.

As illustrated in FIG. 8B, in the first variation of the first embodiment, the resonators 50a and 50b are the resonator illustrated in FIG. 6A and FIG. 6B, and the lower electrodes 12 of the resonators 50a and 50b are interconnected in the connection region 22. The region 21 combining the resonance regions 20 and the connection region 22 does not overlap with the ground pattern 33. Other structures are the same as those of the first embodiment illustrated in FIG. 8A, and the description thereof is thus omitted.

The magnitude of second harmonic in the filter was simulated for the first comparative example in which the floating capacitance Cf is large and the first embodiment that reduces the floating capacitance Cf. Simulated was a transmit filter for Band7 (transmit band: 2500 to 2570 MHz, receive band: 2620 to 2690 MHz) of Evolved Universal Terrestrial Radio Access (E-UTRA) Operating Band.

Figures 9A, 9B:
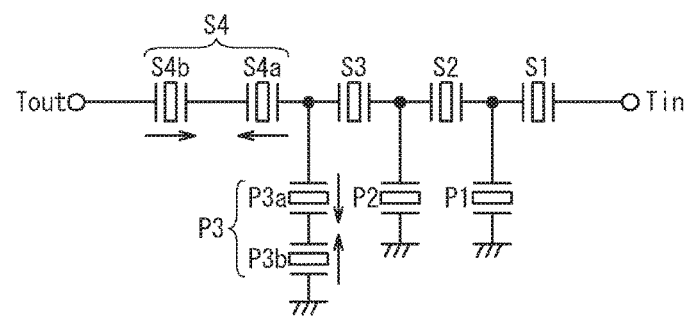
FIG. 9A is a circuit diagram of a ladder-type filter of the first embodiment and the first comparative example.
FIG. 9B presents the electrostatic capacitance value and the resonant frequency of each resonator.

FIG. 9A is a circuit diagram of a ladder-type filter of the first embodiment and the first comparative example, and FIG. 9B presents the electrostatic capacitance value and the resonant frequency of each resonator. As illustrated in FIG. 9A, the filter includes series resonators S1 through S4 and parallel resonators P1 through P3. The series resonators S1 through S4 are connected in series between an input terminal Tin and an output terminal Tout, and the parallel resonators P1 through P3 are connected in parallel between the input terminal Tin and the output terminal Tout. The series resonator S4, which is closest to the output terminal Tout among the series resonators S1 through S4, is divided in reverse series into resonators S4a and S4b. The parallel resonator P3, which is closest to the output terminal Tout among the parallel resonators P1 through P3, is divided in reverse series into resonators P3a and P3b. Harmonics generated in the series resonators S1 through S3 and the parallel resonators P1 and P2 are suppressed in the series resonator S4 and the parallel resonator P3 closest to the output terminal Tout. Thus, to reduce the size, the series resonator S4 and the parallel resonator P3 are preferably divided in reverse series, and other resonators are preferably not divided.

As illustrated in FIG. 9B, the resonators S4a and S4b have identical electrostatic capacitance values and identical resonant frequencies. The resonators P3a and P3b have identical electrostatic capacitance values and identical resonant frequencies.

In the ladder-type filter, the resonant frequencies of the series resonators S1 through S4 and the antiresonant frequencies of the parallel resonators P1 through P3 are located around the center of the passband. The antiresonant frequencies of the series resonators S1 through S4 are located at frequencies higher than the passband. The resonant frequencies of the parallel resonators P1 through P3 are located at frequencies lower than the passband. As illustrated in FIG. 4, the second harmonic due to the floating capacitance Cf is large at a frequency twice the antiresonant frequency. Thus, the resonator of which the second harmonic is located in the band twice the passband is the parallel resonator P3. Therefore, it is important to reduce the floating capacitance Cf in the parallel resonator P3.

Figure 10:
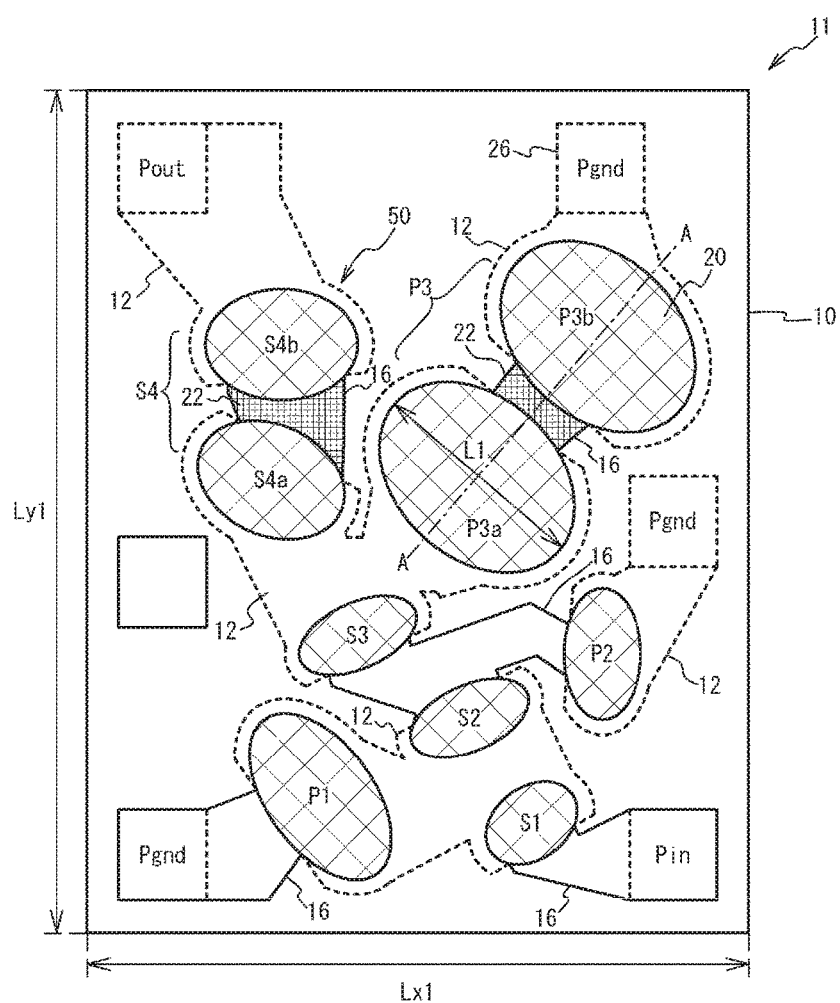
FIG. 10 is a plan view of a filter chip in the first embodiment and the first comparative example.

FIG. 10 is a plan view of a filter chip in the first embodiment and the first comparative example. FIG. 10 illustrates the lower surface of the filter chip transparently viewed from above. The upper electrodes 16 are indicated by solid lines, and the lower electrodes 12 are indicated by dashed lines. As illustrated in FIG. 10, in a filter chip 11, a plurality of piezoelectric thin film resonators 50 and a plurality of pads 26 are located on a silicon substrate 10 (the lower surface). The piezoelectric thin film resonators 50 include the series resonators S1 through S4b and the parallel resonators P1 through P3b. The pads 26 include an input pad Pin, an output pad Pout, and ground pads Pgnd. The input pad Pin and the output pad Pout respectively correspond to the input terminal Tin and the output terminal Tout in FIG. 9A.

The region where the upper electrode 16 connects the series resonators S4a and S4b is the connection region 22. The region where the upper electrode 16 connects the parallel resonators P3a and P3b is the connection region 22. The length Lx1 of the shorter side of the substrate 10 is 730 μm, and the length Ly1 of the longer side is 930 μm. The major axis length L1 of each of the parallel resonators P3a and P3b, which have been divided in reverse series, is 240 μm.

Figure 11A:
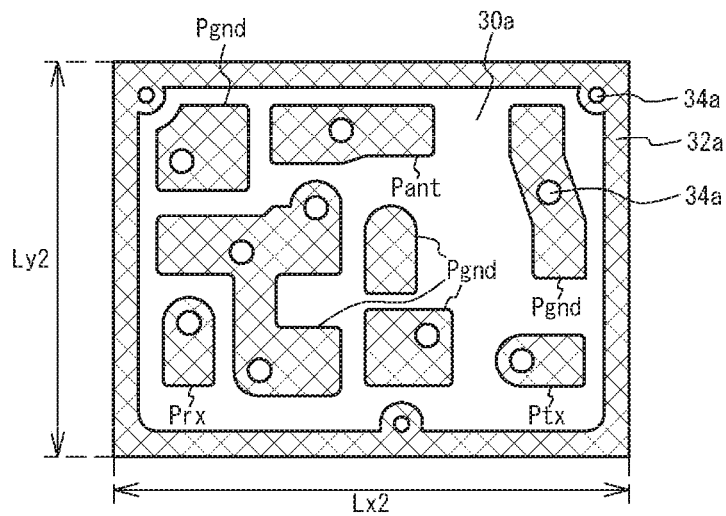
FIG. 11A through FIG. 11C are plan views of patterns of metal layers in the first comparative example.
Figure 11B:
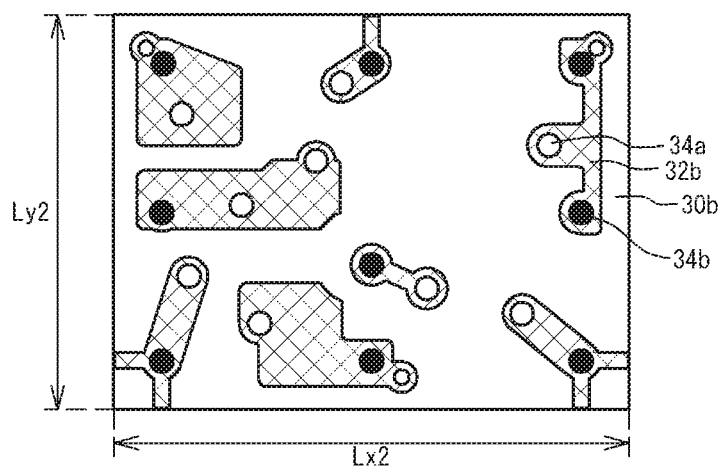
Figure 11C:
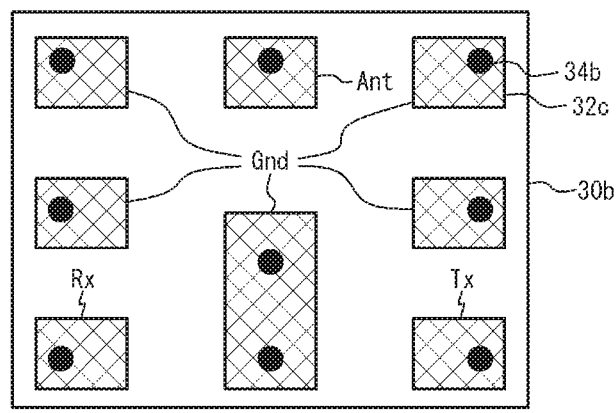

FIG. 11A through FIG. 11C are plan views of patterns of metal layers in the first comparative example. FIG. 11A illustrates the pattern of the metal layer 32a on the upper surface of the insulating layer 30a, FIG. 11B illustrates the pattern of the metal layer 32b on the upper surface of the insulating layer 30b, and FIG. 11C illustrates the pattern of the metal layer 32c on the lower surface of the insulating layer 30b as viewed transparently from above. The via wirings 34a and 34b are respectively indicated by open circles and black circles.

As illustrated in FIG. 11A, the transmit pad Ptx, the common pad Pant, the receive pad Prx, and the ground pads Pgnd are located on the upper surface of the insulating layer 30a. A ring-shaped metal layer is located in the periphery of the insulating layer 30a. The via wirings 34a penetrating through the insulating layer 30a are provided. The input pad Pin, the output pad Pout, and the ground pads Pgnd in FIG.

8A are respectively bonded with the transmit pad Ptx, the common pad Pant, and the ground pads Pgnd through the bumps 36.

As illustrated in FIG. 11B, the via wirings 34a and 34b are coupled to the metal layer 32b located on the upper surface of the insulating layer 30b. As illustrated in FIG. 11C, the transmit terminal Tx, the common terminal Ant, the receive terminal Rx, and the ground terminals Gnd are located on the lower surface of the insulating layer 30b. The transmit terminal Tx, the common terminal Ant, the receive terminal Rx, and the ground terminals Gnd are respectively electrically connected to the transmit pad Ptx, the common pad Pant, the receive pad Prx, and the ground pads Pgnd in FIG. 11A through the via wirings 34a and 34b and the metal layer 32b. The length Lx2 of the longer side of each of the insulating layers 30a and 30b is 1700 μm, and the length Ly2 of the shorter side is 1300 μm.

Figure 12:
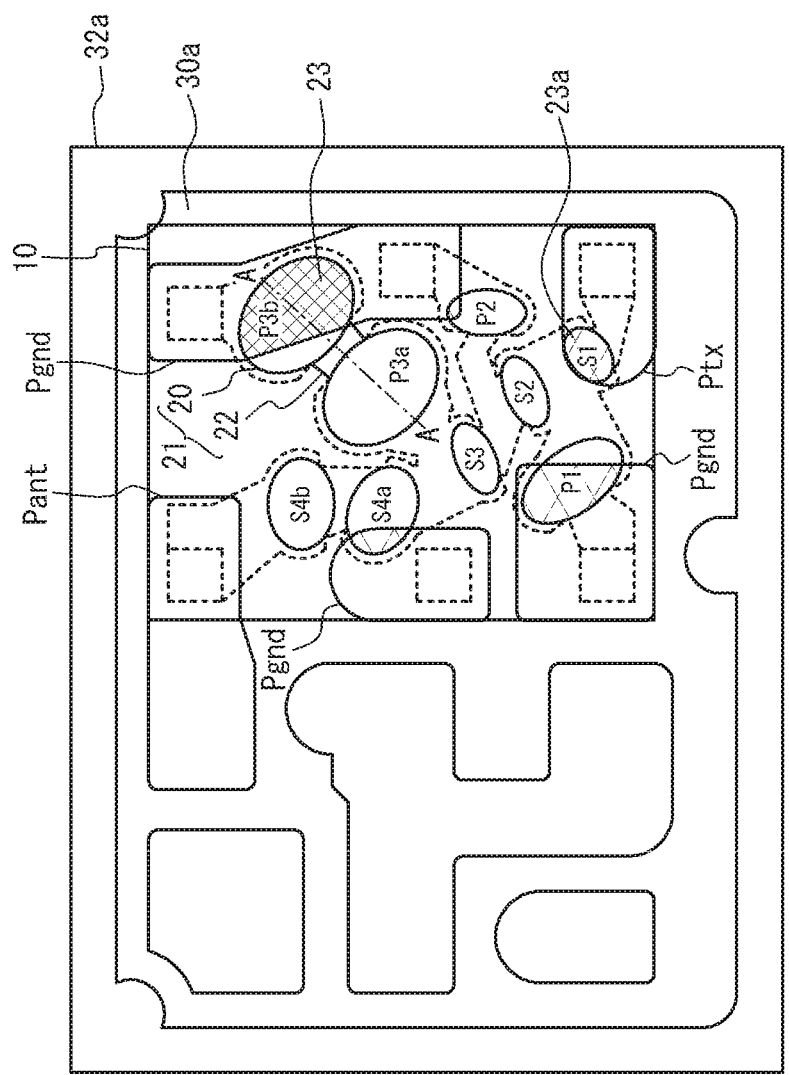
FIG. 12 is a plan view of the filter chip mounted on the substrate in the first comparative example.

FIG. 12 is a plan view of a filter chip mounted on a substrate in the first comparative example. The lower surface of the filter chip 11 is illustrated as viewed transparently from above. The upper electrode 16 and the lower electrode 12 formed on the substrate 10 are indicated by dashed lines except the resonance regions 20 and the connection region 22. In the resonance regions 20 and the connection region 22, regions 23 and 23a overlapping with pads located on the upper surface of the substrate 30 in plan view are indicated by cross hatching. A part of the resonance region 20 of the series resonator S1 overlaps with the transmit pad Ptx in the region 23a, and a part of the resonance region 20 of the series resonators S4a overlaps with the ground pad Pgnd in the region 23a. A part of the resonance region 20 of each of the parallel resonators P1 and P2 overlaps with the ground pad Pgnd in the region 23a. To reduce second harmonic, the region 23 in which the parallel resonator P3b overlaps with the ground pad Pgnd is to be considered.

Figure 13:
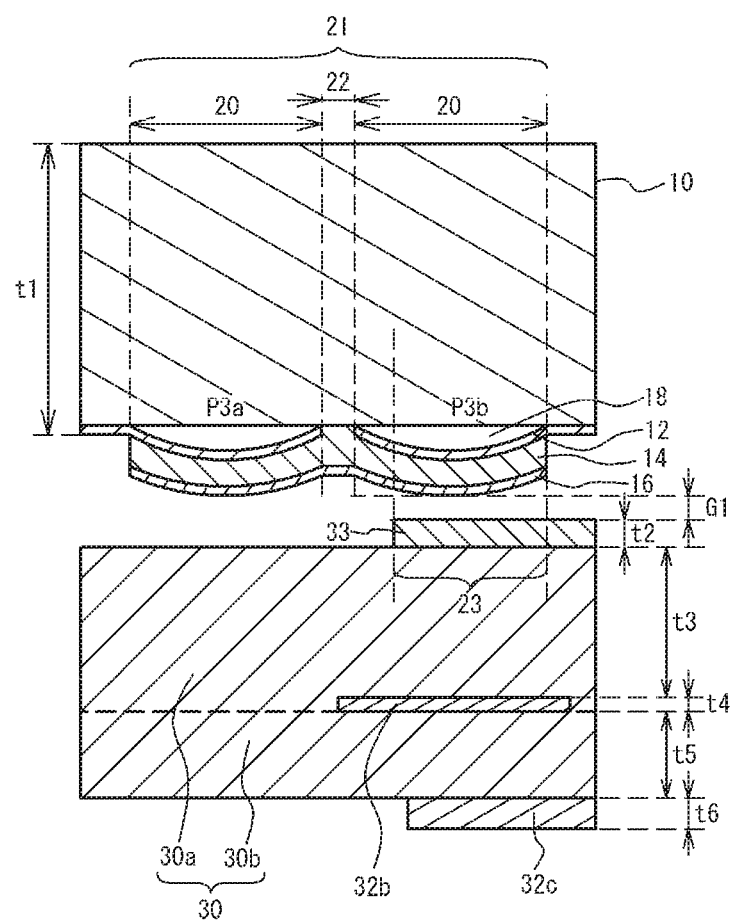
FIG. 13 is a cross-sectional view taken along line A-A in FIG. 12 in the first comparative example.

FIG. 13 is a cross-sectional view taken along line A-A in FIG. 12 in the first comparative example. As illustrated in FIG. 13, the ground pattern 33 corresponding to the ground pad Pgnd overlaps with a part of the resonance region 20 of the parallel resonator P3b in the region 23. The thickness t1 of the substrate 10 is 250 μm, the thickness t2 of the ground pattern 33 is 15 μm, the thickness t3 of the insulating layer 30a is 90 μm, the thickness t4 of the metal layer 32b is 7 μm, the thickness t5 of the insulating layer 30b is 40 μm, and the thickness t6 of the metal layer 32c is 15 μm. The distance G1 between the upper electrode 16 and the ground pattern 33 is 10 μm. The area of the region 23 is 20787 μm². The calculated floating capacitance Cf in this structure is 0.037 pF.

Figure 14:
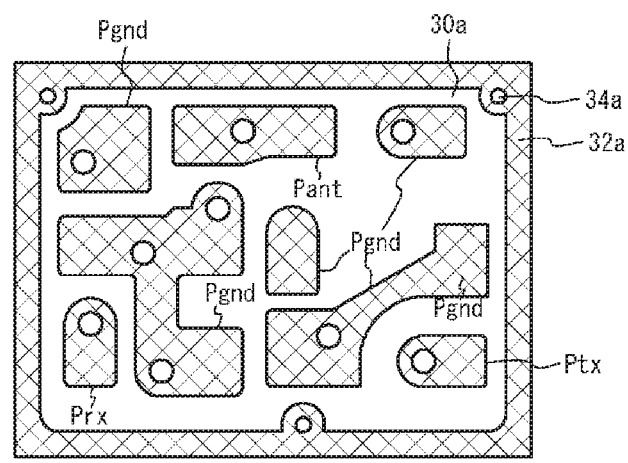
FIG. 14 is a plan view of the pattern of the metal layer in the first embodiment.

FIG. 14 is a plan view of the pattern of the metal layer in the first embodiment. As illustrated in FIG. 14, the arrangement of the ground pads Pgnd differ from that of the first comparative example. Other patterns are the same as those of the first comparative example, and the description thereof is thus omitted.

Figure 15:
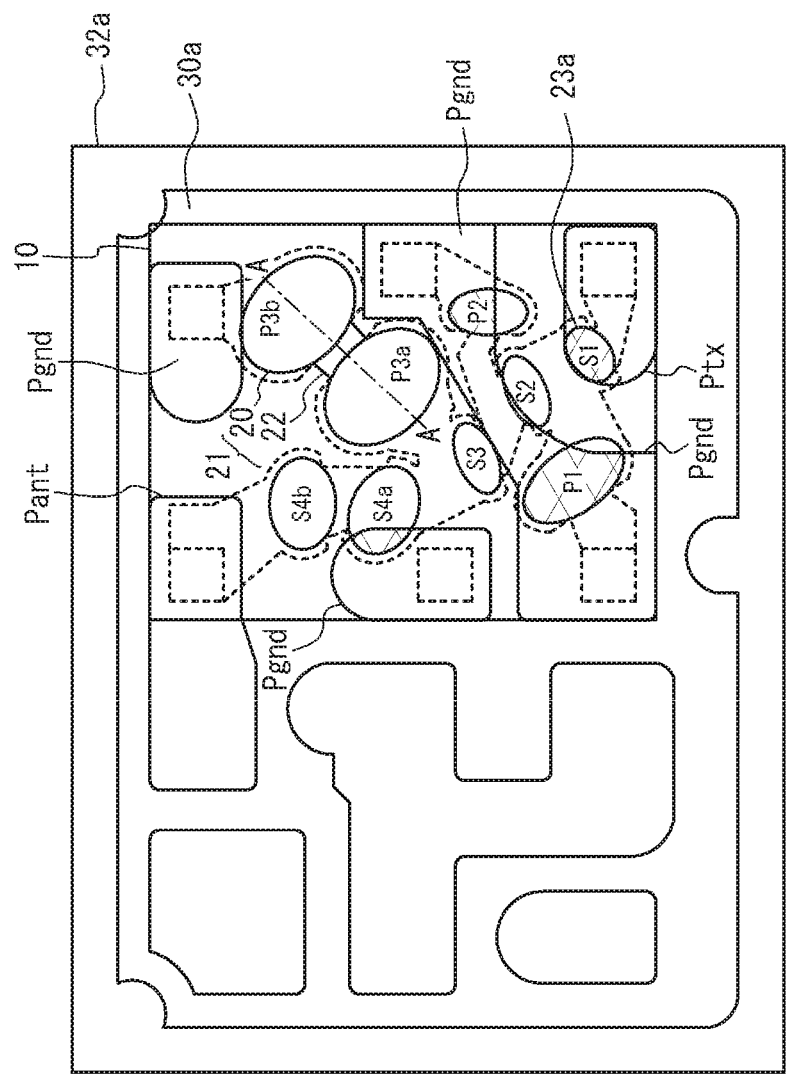
FIG. 15 is a plan view of the filter chip mounted on the substrate in the first embodiment.

FIG. 15 is a plan view of the filter chip mounted on a substrate in the first embodiment. As illustrated in FIG. 15, the resonance region 20 of the parallel resonator P3b does not overlap with the ground pad Pgnd, and the resonance region 20 of the parallel resonator P2 overlaps with the ground pad Pgnd more than that of the first comparative example. Other structures are the same as those of the first comparative example, and the description thereof is thus omitted.

Figure 16:
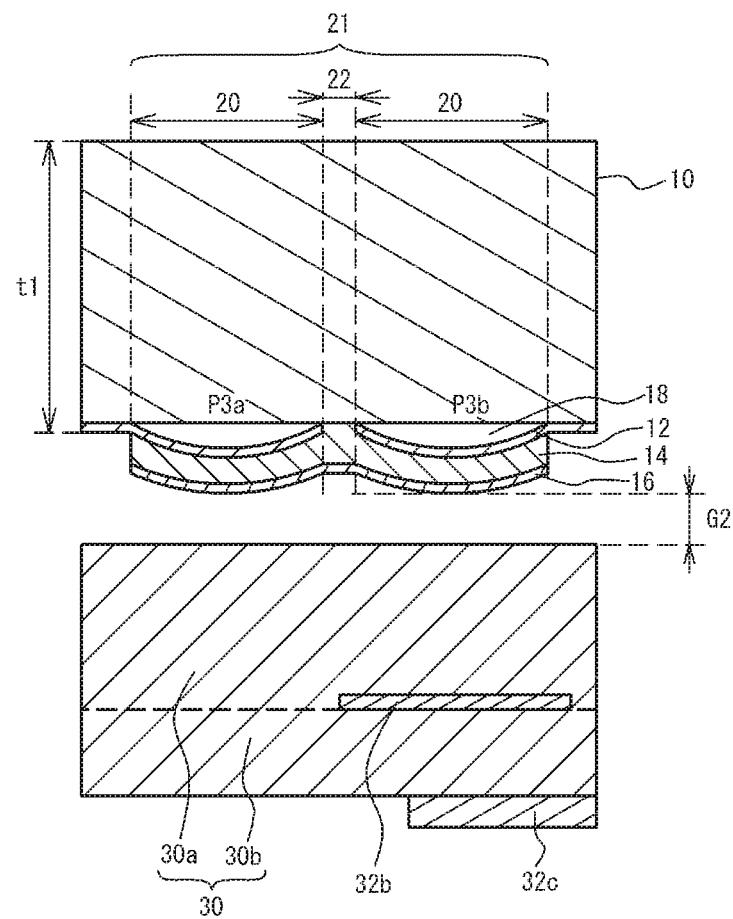
FIG. 16 is a cross-sectional view taken along line A-A in FIG. 15 in the first embodiment.

FIG. 16 is a cross-sectional view taken along line A-A in FIG. 15 in the first embodiment. As illustrated in FIG. 16, the resonance regions 20 of the parallel resonators P3a and P3b and the connection region 22 do not overlap with the ground pad Pgnd. That is, the area of the region 23 is 0 μm². The distance G2 between the upper electrode 16 and the insulating layer 30a is 25 μm. The calculated floating capacitance Cf in this structure is 0.018 pF.

The substrate 10 was assumed to be a silicon substrate, and the lower electrode 12 and the upper electrode 16 were assumed to be mainly formed of a Ru film. The substrate 30 was assumed to be an LTCC substrate. The passband was assumed to be from 2500 MHz to 2570 MHz, and the frequency band of second harmonic was assumed to be from 5000 MHz to 5140 MHz. Simulated was the magnitude of the second harmonic emitted from the common terminal Ant when a high-frequency signal of 28 dBm is input to the transmit terminal Tx. The simulation method for second harmonic was the same as that in FIG. 4.

Figure 17:
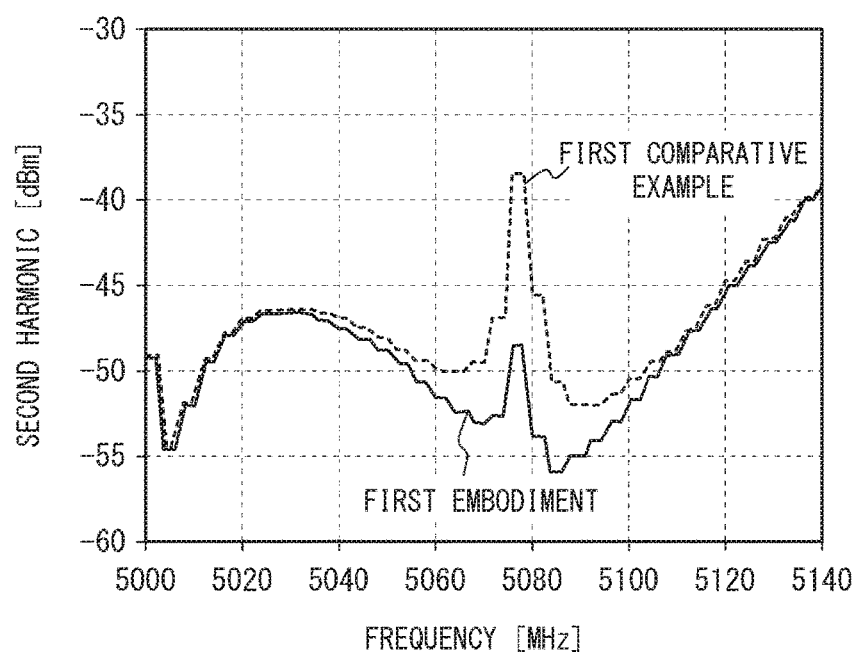
FIG. 17 is a graph of second harmonic versus frequency in the first embodiment and the first comparative example.

FIG. 17 is a graph of second harmonic versus frequency in the first embodiment and the first comparative example. As illustrated in FIG. 17, in the first comparative example, the peak of the second harmonic, of which the magnitude is approximately −40 dBm, is present around the center of the frequency band twice the passband. In the first embodiment, the magnitude of the peak is approximately −50 dBm, and is improved by approximately 10 dB. As described above, the first embodiment reduces second harmonics compared to the first comparative example.

Next, the floating capacitance when the overlap between the upper electrode 16 and the ground pattern is varied was simulated. FIG. 18A through FIG. 18D illustrate models for the simulation. As illustrated in FIG. 18A through FIG. 18D, an electrode 64 is located on the lower surface of a silicon substrate 60, and an electrode 66 is located on the upper surface of an LTCC substrate 62. An air layer 65 is located between the silicon substrate 60 and the LTCC substrate 62.

The thickness t1 of the silicon substrate 60 was assumed to be b 250 μm, and the thickness t2 of the LTCC substrate 62 was assumed to be 130 μm. The thickness of the electrode 64 was assumed to be 1μm, and the thickness of the electrode 66 was assumed to be 5 μm. The thickness G3 of the air layer 65 between the electrodes 64 and 66 was assumed to be 10 μm. The length L of each of the electrodes 64 and 66 was assumed to be 180 μm. The relative permittivities of the silicon substrate 60, the LTCC substrate 62, and the air layer 65 were respectively assumed to be 11.8, 9.8, and 1.0.

Figure 18A:
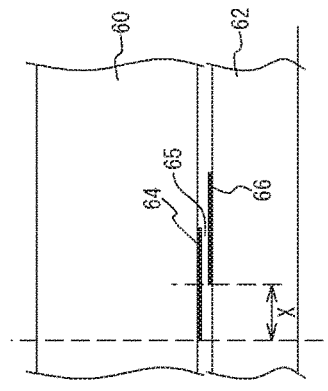
FIG. 18A through FIG. 18D illustrate models for a simulation.
Figure 18B:
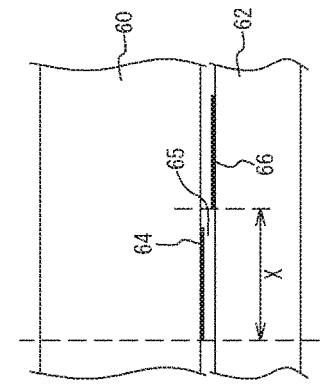
Figure 18C:
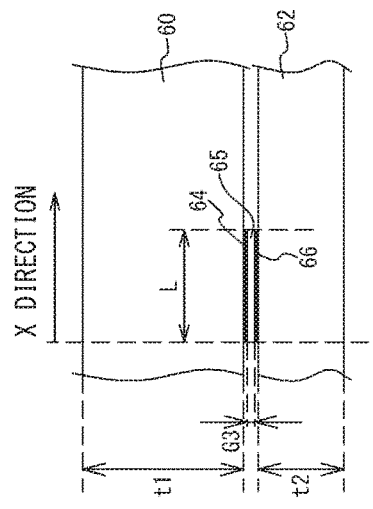
Figure 18D:
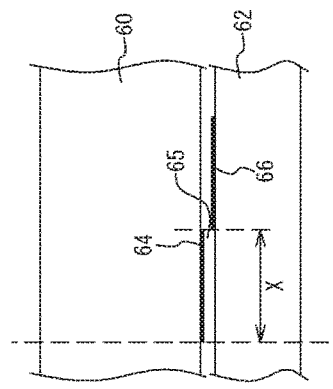

The shift length of the electrode 66 from the electrode 64 in the X direction was assumed to be X. In FIG. 18A, since the electrodes 64 and 66 overlap in the X direction, X=0 μm. In FIG. 18B, since the electrode 66 is shifted from the electrode 64 in the X direction by L/2, X=90 μm. In FIG. 18C, since the electrode 66 is shifted from the electrode 64 in the X direction by L, X=180 μm. In FIG. 18D, since the separate distance in plan view between the electrodes 66 and 64 is 30 μm, X=210 μm.

FIG. 19A through FIG. 19D illustrate equipotential lines. As illustrated in FIG. 19A through FIG. 19D, equipotential lines 68 can be simulated.

Figure 19B:
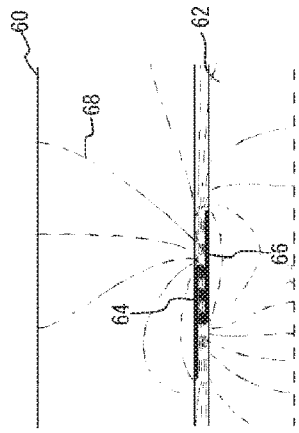
FIG. 19A through FIG. 19D illustrate equipotential lines.
Figure 19D:
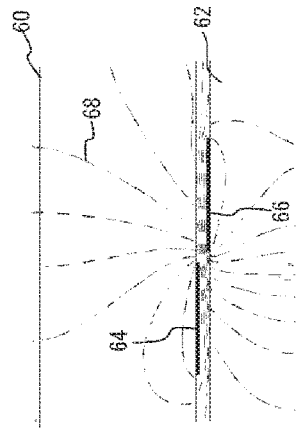
Figure 19A:
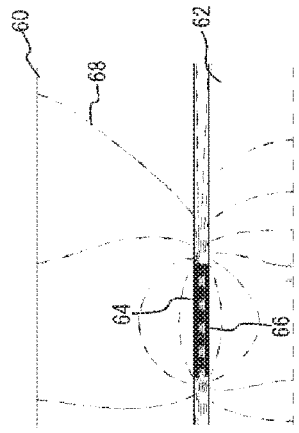
Figure 19C:
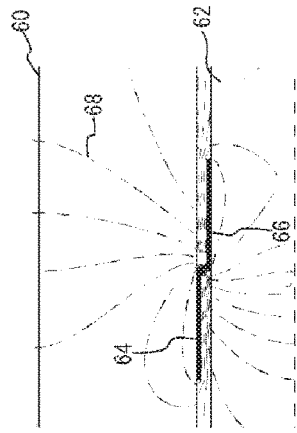
Figure 20:
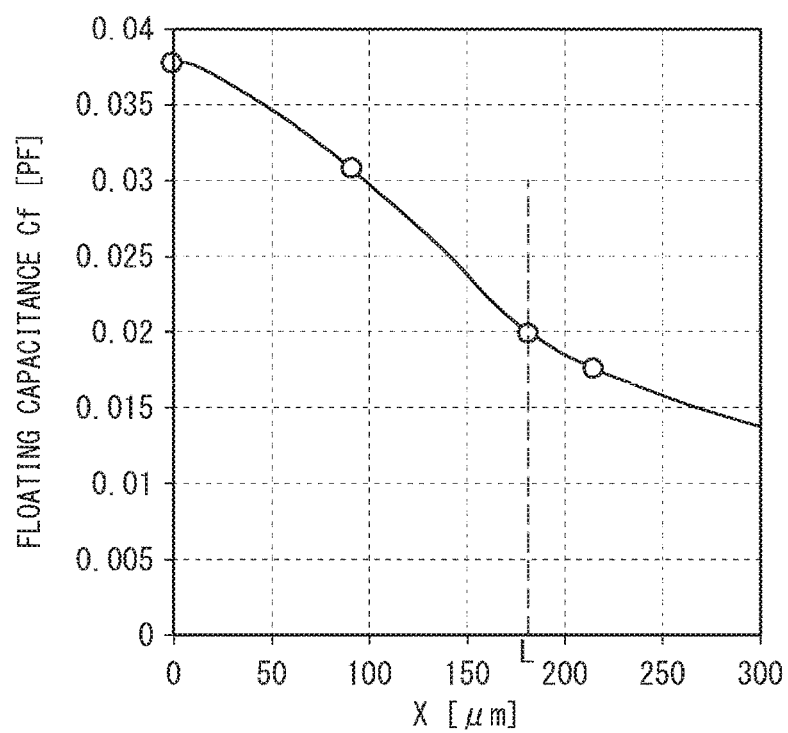
FIG. 20 is a graph of floating capacitance Cf versus X.

FIG. 20 is a graph of floating capacitance Cf versus X. The floating capacitances Cf simulated In FIG. 19A through FIG. 19D are indicated by open circles. The curve is an approximate curve. As illustrated in FIG. 20, as X increases, the floating capacitance Cf decreases. When 0<X<L, as X increases, the floating capacitance Cf decreases. The floating capacitance Cf when X=L is approximately the half of the floating capacitance Cf when X=0. This is because the density of the equipotential line between the electrodes 64 and 66 decreases as X increases as illustrated in FIG. 19A through FIG. 19C. When L<X, the decrease in floating capacitance Cf is small even when X increases. This is because dense equipotential lines remain between the electrodes 64 and 66 even when the electrodes 64 and 66 separate from each other in plan view as illustrated in FIG. 19D. As described above, the floating capacitance Cf is reduced when the electrodes 64 and 66 do not overlap in plan view.

In the first embodiment, as illustrated in FIG. 8A, the resonator 50a (a first piezoelectric thin film resonator) and the resonator 50b (a second piezoelectric thin film resonator) are located on the lower surface of the substrate 10 (a first substrate). Between the resonators 50a and 50b, the crystal orientation from the upper electrode 16 (a first electrode) to the lower electrode 12 (a second electrode) of the piezoelectric film 14 is the same. As illustrated in FIG. 8A, in the connection region 22 between the resonance regions 20, the upper electrodes 16 are interconnected, the lower electrodes 12 are not interconnected, and the areas of the resonance regions 20 are practically identical to the extent of the production error. This structure reduces second harmonics as illustrated in FIG. 2C.

Furthermore, the substrate 10 is mounted on the substrate 30 (a second substrate) so that the upper surface of the substrate 30 faces the lower surface of the substrate 10 across the air gap 38. The ground pattern 33 located on the upper surface of the substrate 30 illustrated in FIG. 7A does not overlap with the upper electrode 16 located in the resonance regions 20 of the resonators 50a and 50b and the connection region 22 in plan view. This structure reduces the electrostatic capacitance between the ground pattern 33 and the upper electrode 16 as illustrated in FIG. 20. Thus, the floating capacitance Cf in FIG. 7B is reduced, and thereby second harmonics are reduced.

The piezoelectric films 14 of the resonator 50a and the resonator 50b may be separated in the connection region 22, but the piezoelectric films 14 of the resonator 50a and the resonator 50b and the piezoelectric film 14 in the connection region 22 are preferably made of a single piezoelectric film. This structure allows the crystal orientation from the upper electrode 16 to the lower electrode 12 of the piezoelectric film 14 to be the same between the resonators 50a and 50b. In addition, the film thickness of the piezoelectric film 14 is made to be practically uniform. This structure further reduces second harmonics.

As illustrated in FIG. 15, a piezoelectric thin film resonator at least a part of the resonance region of which overlaps with the ground pattern 33 is located on the lower surface of the substrate 10. The ground pattern 33 is provided so as not to overlap with a region in which second harmonic is generated (the resonance regions 20 of the parallel resonators P3a and P3b and the connection region 22) among the piezoelectric thin film resonators located on the lower surface of the substrate 10 and so as to overlap with at least a part of the resonance region 20 of the piezoelectric thin film resonator in which second harmonic is relatively less generated. This structure reduces the floating capacitance Cf without extremely losing the degree of freedom for the layout of the ground pattern 33.

As illustrated in FIG. 10, one or more series resonators S1 through S4 are connected in series between the input pad Pin and the output pad Pout, and one or more parallel resonators P1 through P3 are connected in parallel between the input pad Pin and the output pad Pout. At least one parallel resonator P3 of one or more parallel resonators P1 through P3 is formed of the resonators P3a and P3b that are divided in reverse series. As illustrated in FIG. 4, second harmonic due to the floating capacitance Cf is large at a frequency twice the antiresonant frequency. The antiresonant frequency of the parallel resonator P3 is located at the center of the passband. Thus, the reverse series division of the parallel resonator P3 reduces second harmonics in the frequency band twice the passband.

The parallel resonator P3 closest to the input pad among the parallel resonators P1 through P3 is divided in reverse series. This structure further reduces second harmonics.

As illustrated in FIG. 15, the ground pattern 33 overlaps with at least a part of the resonance region of at least one of one or more series resonators S1 through S4 and one or more parallel resonators P1 through P3 in plan view. As described above, the ground pattern 33 is made not to overlap with the region in which second harmonic is generated and to overlap with the resonator in which second harmonic is relatively less generated. This structure reduces the floating capacitance Cf without drastically losing the degree of freedom for the layout of the ground pattern 33.

At least two pads of the ground pads Pgnd are bonded with one ground pattern 33 through the bumps 36. For the filter characteristics, there may be a case where the ground pads Pgnd are preferably commonly connected near the filter. In such a case, the ground pattern 33 to which the ground pads Pgnd are connected is made not to overlap with the region 21. This structure reduces second harmonics.

As in the first variation of the first embodiment in FIG. 8B, the first electrode connected in the connection region 22 may be the lower electrode 12 located between the substrate 10 and the piezoelectric film 14.

As in the first embodiment in FIG. 8A, the second electrodes that are not connected in the connection region 22 may be the lower electrode 12 located between the substrate 10 and the piezoelectric film 14.

Figure 21A:
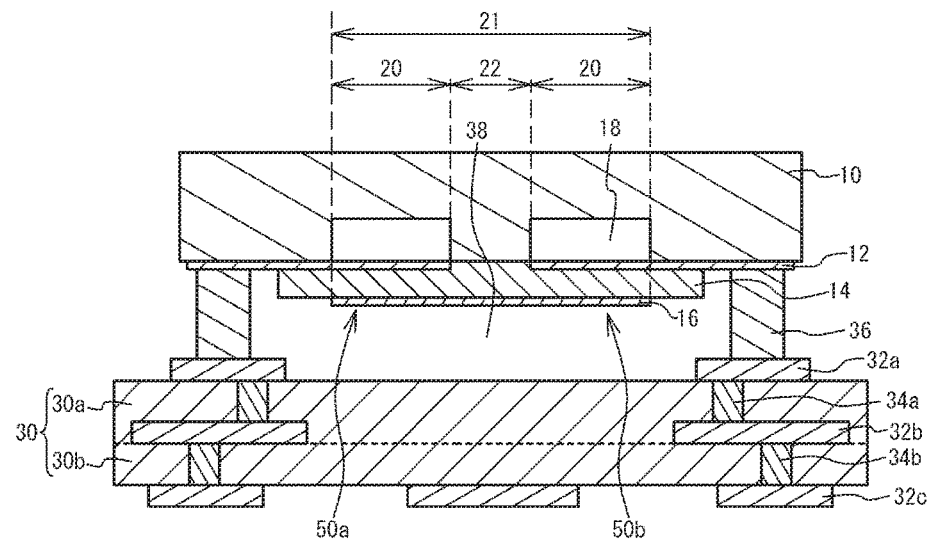
FIG. 21A and FIG. 21B are cross-sectional views of filters in accordance with second and third variations of the first embodiment.
Figure 21B:
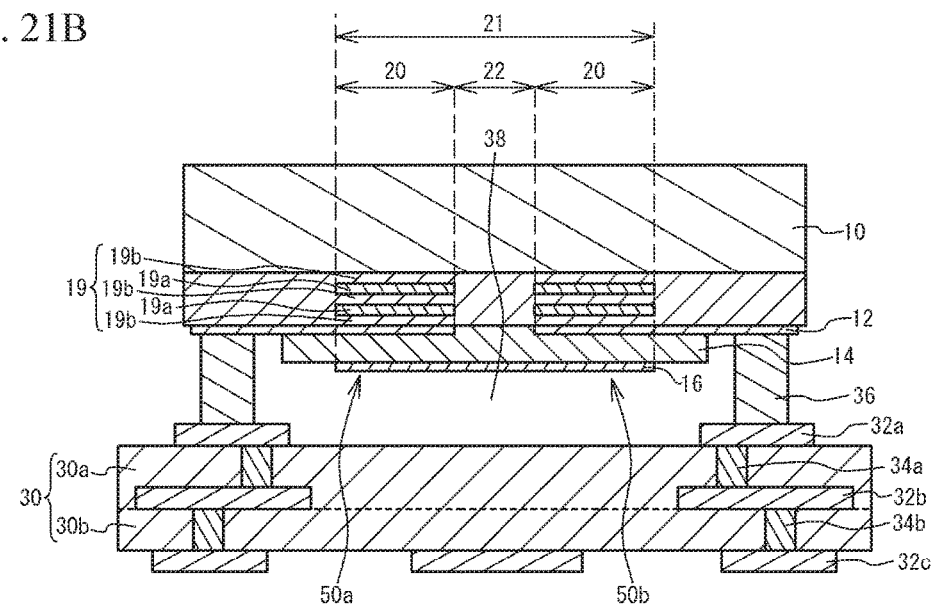

FIG. 21A and FIG. 21B are cross-sectional views of filters in accordance with second and third variations of the first embodiment, respectively. As illustrated in FIG. 21A, a recess is formed on the upper surface (the lower surface in the drawing) of the substrate 10. The lower electrode 12 is flatly formed on the substrate 10. This structure forms the air gap 18 in the recess of the substrate 10. The air gap 18 is formed so as to include the resonance region 20. Other structures are the same as those of the first embodiment, and the description thereof is thus omitted. The air gap 18 may be formed so as to penetrate through the substrate 10.

As illustrated in FIG. 21B, an acoustic mirror 19 is formed under (above in the drawing) the lower electrode 12 in the resonance region 20. The acoustic mirror 19 includes films 19a with low acoustic impedance and films 19b with high acoustic impedance alternately stacked. The film thickness of each of the films 19a and 19b is, for example, $\lambda/4$ ($\lambda$ is the wavelength of the acoustic wave). It is freely selected how many films 19a and 19b are stacked. For example, the acoustic mirror 19 may have a structure in which a single layer film with acoustic impedance different from that of the substrate 10 is located in the substrate 10. Other structures are the same as those of the first embodiment, and the description thereof is thus omitted.

In the first embodiment and the first variation thereof, the air gap 18 may be formed in the same manner as the second variation of the first embodiment, or the acoustic mirror 19 may be formed instead of the air gap 18 as in the third variation of the first embodiment.

As in the first embodiment and the first and second variations thereof, the piezoelectric thin film resonator may be a film bulk acoustic resonator (FBAR) in which the air gap 18 is formed between the substrate 10 and the lower electrode 12 in the resonance region 20. Alternatively, as in the third variation of the first embodiment, the piezoelectric thin film resonator may be a solidly mounted resonator (SMR) including the acoustic mirror 19 that reflects the acoustic wave propagating through the piezoelectric film 14 under the lower electrode 12 in the resonance region 20.

Figure 22:
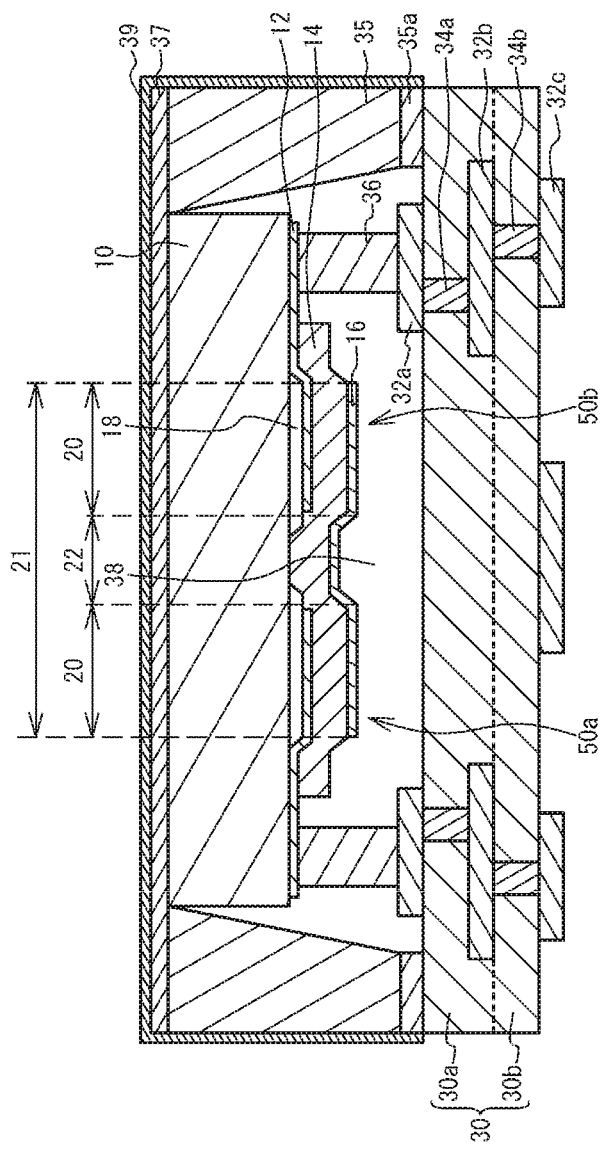
FIG. 22 is a cross-sectional view of a filter in accordance with a fourth variation of the first embodiment.

FIG. 22 is a cross-sectional view of a filter in accordance with a fourth variation of the first embodiment. As illustrated in FIG. 22, a ring-shaped electrode 35a is formed in the periphery of the upper surface of the substrate 30. A sealing portion 35 is located on the substrate 30 so as to surround the substrate 10. The sealing portion 35 is bonded with the ring-shaped electrode 35a. A lid 37 is located on the upper surfaces of the substrate 10 and the sealing portion 35. A protective film 39 is located on the sealing portion 35, the lid 37, and the ring-shaped electrode 35a. The sealing portion 35 is made of, for example, metal such as solder or an insulating material such as resin. The ring-shaped electrode 35a is formed of a metal film. The lid 37 is a metal plate made of kovar or the like or an insulating plate. The protective film 39 is a metal film such as a nickel film or the like or an insulating film. As in the fourth variation of the first embodiment, the sealing portion 35 surrounding the substrate 10 may be provided.

In the first embodiment and the variations thereof, an acoustic wave element such as a surface acoustic wave element or a piezoelectric thin film resonator may be located on the upper surface of the substrate 30.

A ladder-type filter is described as an example of the filter, but the filter may be other than the ladder-type filter. The number of series resonators and the number of parallel resonators included in the filter are freely selected.

Second Embodiment

Figure 23:
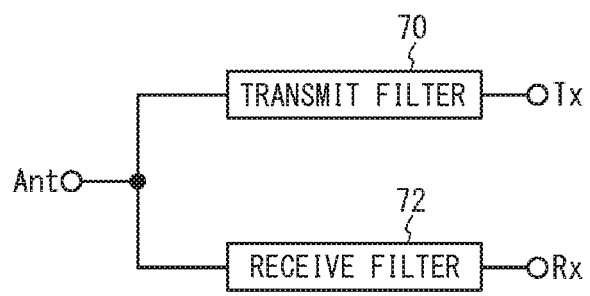
FIG. 23 is a circuit diagram of a duplexer in accordance with a second embodiment.

A second embodiment is an exemplary multiplexer such as a duplexer. FIG. 23 is a circuit diagram of a duplexer in accordance with the second embodiment. As illustrated in FIG. 23, a transmit filter 70 is connected between the common terminal Ant and the transmit terminal Tx. A receive filter 72 is connected between the common terminal Ant and the receive terminal Rx. The transmit filter 70 transmits signals in the transmit band to the common terminal Ant among high-frequency signals input from the transmit terminal Tx, and suppresses other signals. The receive filter 72 allows signals in the receive band among high-frequency signals input to the common terminal Ant to pass therethrough, and suppresses other signals.

At least one of the transmit filter 70 and the receive filter 72 is the filter according to any one of the first embodiment and the variations thereof. This configuration reduces second harmonics. Second harmonic is a problem in the transmit filter 70 to which large input signal is input. Thus, the filter according to any one of the first embodiment and the variations thereof is preferably used for the transmit filter 70. The duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A filter comprising:
a first substrate;
a first piezoelectric thin film resonator and a second piezoelectric thin film resonator located on a lower surface of the first substrate, each of the first piezoelectric thin film resonator and the second piezoelectric thin film resonator including a piezoelectric film, and a first electrode and a second electrode facing each other across the piezoelectric film, a crystal orientation from the first electrode to the second electrode of the piezoelectric film of the first piezoelectric thin film resonator being identical to that of the second piezoelectric thin film resonator in a resonance region where the first electrode and the second electrode face each other across the piezoelectric film, the first electrodes of the first piezoelectric thin film resonator and the second piezoelectric thin film resonator connecting to each other in a connection region between the resonance regions, the second electrodes of the first piezoelectric thin film resonator and the second piezoelectric thin film resonator failing to connect to each other in the connection region, and an area of the resonance region of the first piezoelectric thin film resonator being approximately equal to that of the second piezoelectric thin film resonator,
a second substrate, the first substrate being mounted on an upper surface of the second substrate so that the upper surface faces the lower surface of the first substrate across an air gap; and
a ground pattern that is located on the upper surface of the second substrate, and does not overlap with the first electrode located in the resonance regions of the first piezoelectric thin film resonator and the second piezoelectric thin film resonator and the connection region in plan view.

2. The filter according to claim 1, wherein
the piezoelectric films of the first piezoelectric thin film resonator and the second piezoelectric thin film resonator and a piezoelectric film in the connection region are formed of a single piezoelectric film.

3. The filter according to claim 1, further comprising:
a third piezoelectric thin film resonator that is located on the lower surface of the first substrate, includes another piezoelectric film, and another first electrode and another second electrode facing each other across the another piezoelectric film, at least a part of another resonance region where the another first electrode and the another second electrode face each other across the another piezoelectric film overlapping with the ground pattern in plan view.

4. The filter according to claim 1, further comprising:
an input pad and an output pad located on the lower surface of the first substrate;
one or more parallel resonators that are located on the lower surface of the first substrate, and are connected in parallel between the input pad and the output pad, at least one parallel resonator of the one or more parallel resonators being divided in series into the first piezoelectric thin film resonator and the second piezoelectric thin film resonator; and
one or more series resonators that are located on the lower surface of the first substrate, and are connected in series between the input pad and the output pad.

5. The filter according to claim 4, wherein
the at least one parallel resonator includes a parallel resonator closest to the input pad among the one or more parallel resonators.

6. The filter according to claim 5, wherein
the one or more series resonators and the one or more parallel resonators are piezoelectric thin film resonators, and the ground pattern overlaps with at least a part of the resonance region of at least one of the one or more series resonators and the one or more parallel resonators in plan view.

7. The filter according to claim 5, further comprising a plurality of ground pads located on the lower surface of the first substrate, wherein
at least two pads of the plurality of ground pads are bonded with one ground pattern of the ground pattern through a plurality of bumps.

8. The filter according to claim 1, wherein the first electrode is located between the first substrate and the piezoelectric film.

9. The filter according to claim 1, wherein the second electrode is located between the first substrate and the piezoelectric film.

10. A multiplexer comprising:
a filter including:
  a first substrate;
  a first piezoelectric thin film resonator and a second piezoelectric thin film resonator located on a lower surface of the first substrate, each of the first piezoelectric thin film resonator and the second piezoelectric thin film resonator including a piezoelectric film, and a first electrode and a second electrode facing each other across the piezoelectric film, a crystal orientation from the first electrode to the second electrode of the piezoelectric film of the first piezoelectric thin film resonator being identical to that of the second piezoelectric thin film resonator in a resonance region where the first electrode and the second electrode face each other across the piezoelectric film, the first electrodes of the first piezoelectric thin film resonator and the second piezoelectric thin film resonator connecting to each other in a connection region between the resonance regions, the second electrodes of the first piezoelectric thin film resonator and the second piezoelectric thin film resonator failing to connect to each other in the connection region, and an area of the resonance region of the first piezoelectric thin film resonator being approximately equal to that of the second piezoelectric thin film resonator,
a second substrate, the first substrate being mounted on an upper surface of the second substrate so that the upper surface faces the lower surface of the first substrate across an air gap; and
a ground pattern that is located on the upper surface of the second substrate, and does not overlap with the first electrode located in the resonance regions of the first piezoelectric thin film resonator and the second piezoelectric thin film resonator and the connection region in plan view.

* * * * *